(12) United States Patent  
Huang

(10) Patent No.: US 8,116,086 B2
(45) Date of Patent: Feb. 14, 2012

(54) USB FLASH DISK WITH NONE-JOINT METALLIC HOUSING

(75) Inventor: Joseph Huang, Taoyuan (TW)

(73) Assignee: Ho E Screw & Hardware Co., Ltd., Lu-Chu, Taoyuan (TW)

( * ) Notice: Subject to any disclaimer, the term of this patent is extended or adjusted under 35 U.S.C. 154(b) by 228 days.

(21) Appl. No.: 12/640,322

(22) Filed: Dec. 17, 2009

(65) Prior Publication Data

US 2010/0290180 A1     Nov. 18, 2010

(30) Foreign Application Priority Data

May 12, 2009   (TW) ................................ 98115626 A

(51) Int. Cl.
    *H05K 5/02*    (2006.01)

(52) U.S. Cl. ......... 361/752; 361/730; 361/737; 439/630
(58) Field of Classification Search .................. 361/730, 361/752; 439/7, 6.1, 630, 76.1
    See application file for complete search history.

(56) References Cited

U.S. PATENT DOCUMENTS

| 7,802,997 B2 * | 9/2010 | Kuo ............................ 439/76.1 |
| 7,872,871 B2 * | 1/2011 | Hiew et al. .................... 361/730 |
| 2007/0293088 A1 * | 12/2007 | Hiew et al. .................... 439/610 |

* cited by examiner

*Primary Examiner* — Dameon Levi
(74) *Attorney, Agent, or Firm* — Guice Patents PLLC

(57) ABSTRACT

A USB flash disk with a none-joint metallic housing, the main point is that the USB flash disk is formed by inserting an internal structure composed of a printed circuit board, a metallic tray and an insulation upper seat in the metallic housing which is a none-joint rectangular pipe formed by drawing shaping.

7 Claims, 10 Drawing Sheets

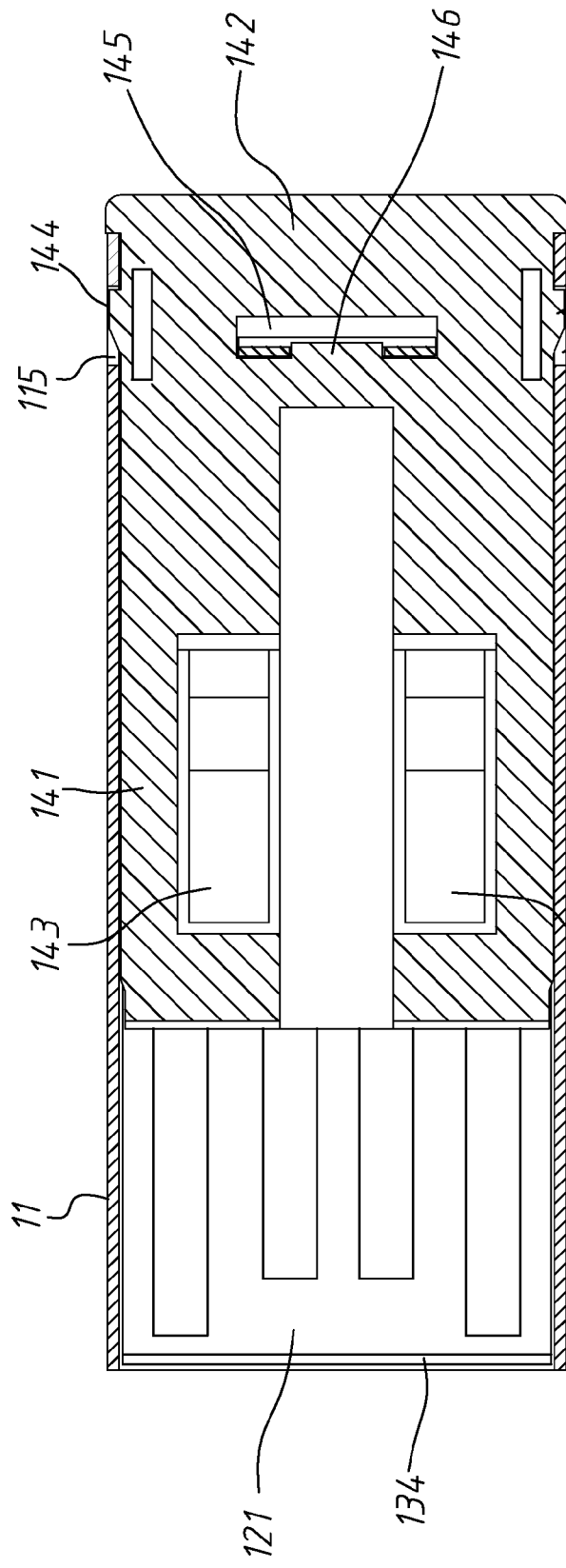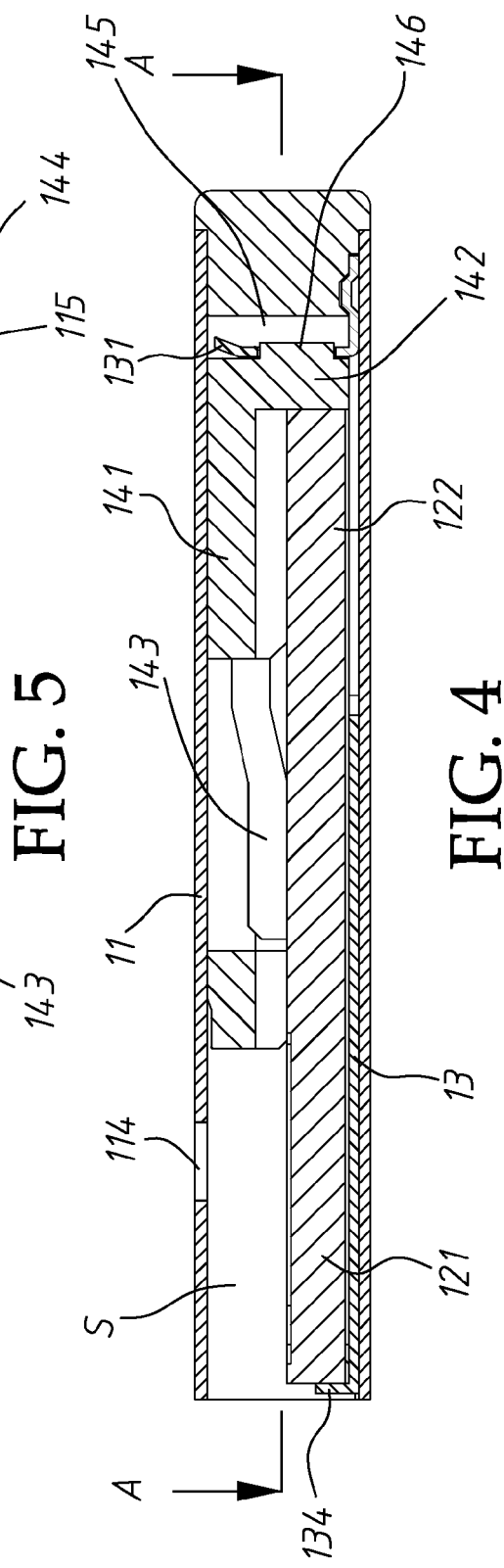
FIG. 5
FIG. 4

USB FLASH DISK WITH NONE-JOINT METALLIC HOUSING

BACKGROUND OF THE INVENTION

1. Field of the Invention

The present invention relates to a structure of a USB flash disk, and especially to a USB flash disk with a none-joint metallic housing.

2. Description of the Prior Art

A USB flash disk is a mobile storage unit; it can be connected with a computer for access of data, and is convenient for carrying on one's person. By nonstop technical progressing, capacities of USB flash disks available nowadays increase from day to day; and scopes of application of USB flash disks are wider and wider.

A conventional USB flash disk is depicted in FIGS. 9-11, it mainly has a metallic housing 91 shaped by punch pressing, the metallic housing 91 is provided over it with a plastic housing 92. And the metallic housing 91 is provided therein with a printed circuit board 93 with a storing function which is abutted against an insulation seat 94 for being positioned.

In such a conventional structure of USB flash disk, the metallic housing 91 is shaped by continuous punch pressing from a metallic board, it is advantageous in fast production and low cost, but a joint 95 will be formed on its metallic housing and make it an inferior appearance, so that it must be enveloped with a plastic sleeve 92 to give it a good appearance. Meantime, the metallic housing 91 always is subjected to deformation at the joint when it is impacted by an external force, this may break the whole USB flash disk and make it useless. Hence, such a USB flash disk needs to be improved.

SUMMARY OF THE INVENTION

The present invention provides a USB flash disk with a none-joint metallic housing, the main point is that the USB flash disk is formed by inserting an internal structure composed of a printed circuit board, a metallic tray and an insulation upper seat in the metallic housing which a none-joint rectangular pipe formed by drawing shaping.

In the USB flash disk with a none-joint metallic housing provided in the present invention, the metallic housing is a none-joint rectangular pipe formed by drawing shaping, its surface is smooth without a seam, thereby the structure of the metallic housing is stiffer than the conventional housing shaped by punch pressing and having a joint, the structure is not subjected to deformation. Particularly, this will render the metallic housing of the whole USB flash disk to be covered with no plastic sleeve for obscuring the joint, and thereby the cost of production of the present invention will be lowered a lot.

And more, by the fact that the metallic housing of the USB flash disk with a none-joint metallic housing provided in the present invention is a none-joint rectangular pipe, the none-joint rectangular pipe is made by drawing shaping and is cut to get a size desired, then the internal elements including the printed circuit board, the metallic tray and the insulation upper seat are inserted in a rear opening of the metallic housing, such assembling is very fast and the size of the metallic housing is very precise. And more, the surface of the metallic housing can be treated with electro-plating, printing, laser carving or marked with a logo to get a beautiful appearance; the metallic housing has much more variant features than conventional USB flash disks.

In the USB flash disk with a none-joint metallic housing provided in the present invention, the insulation upper seat can be made of transparent material, in order that the light beams of an indication light on the printed circuit board can be projected out of a rear end of the upper seat.

The present invention will be apparent in its structural features and effects of using after reading the detailed description of the preferred embodiment thereof in reference to the accompanying drawings.

BRIEF DESCRIPTION OF THE DRAWINGS

FIG. 4 is a sectional view of the first embodiment of the present invention;

FIG. 5 is a sectional view taken from a sectional line A-A in FIG. 4;

DETAILED DESCRIPTION OF THE PREFERRED EMBODIMENT

Figure 1:
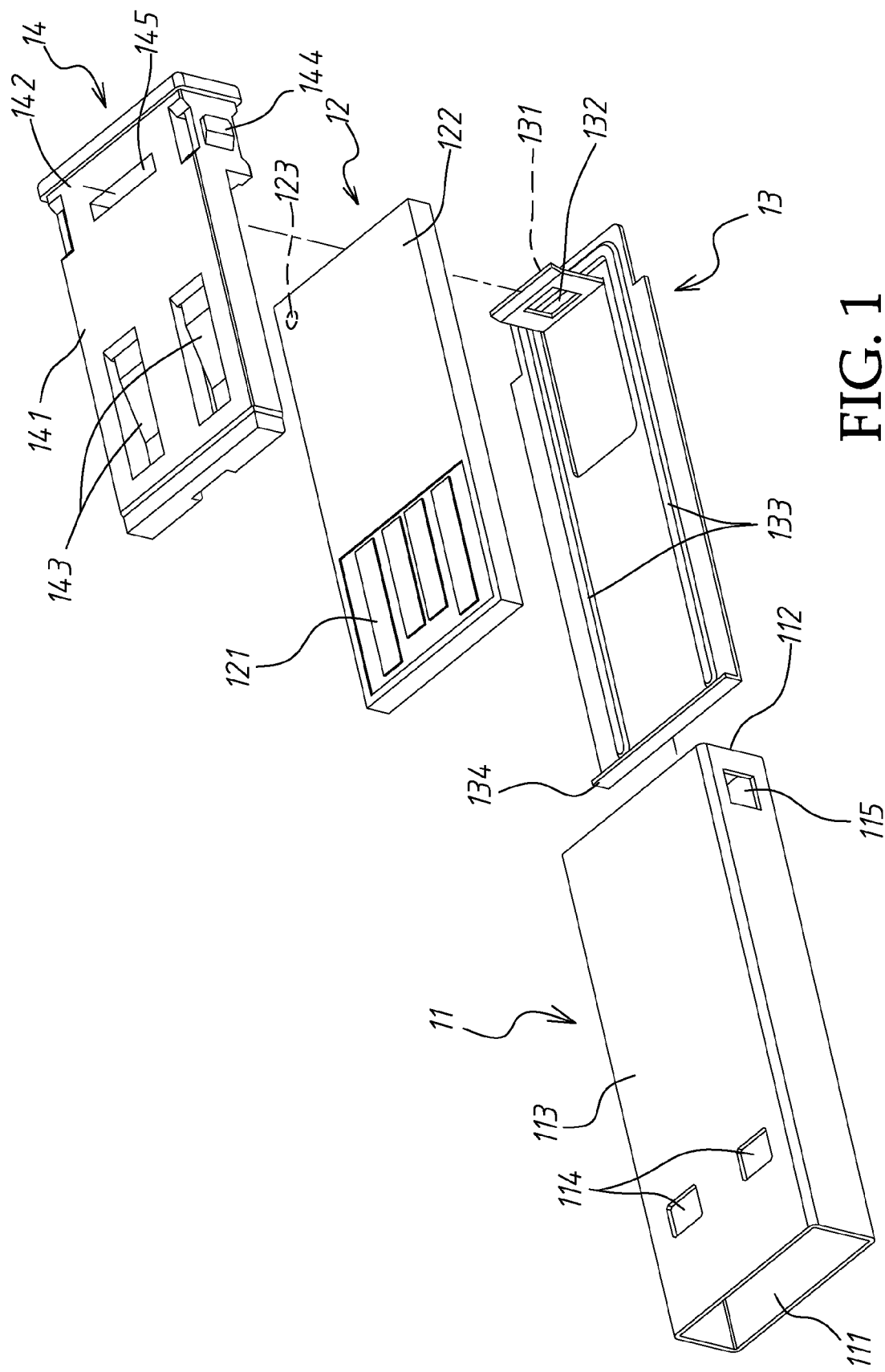
FIG. 1 is an anatomic perspective view of a first embodiment of the present invention.
Figure 2:
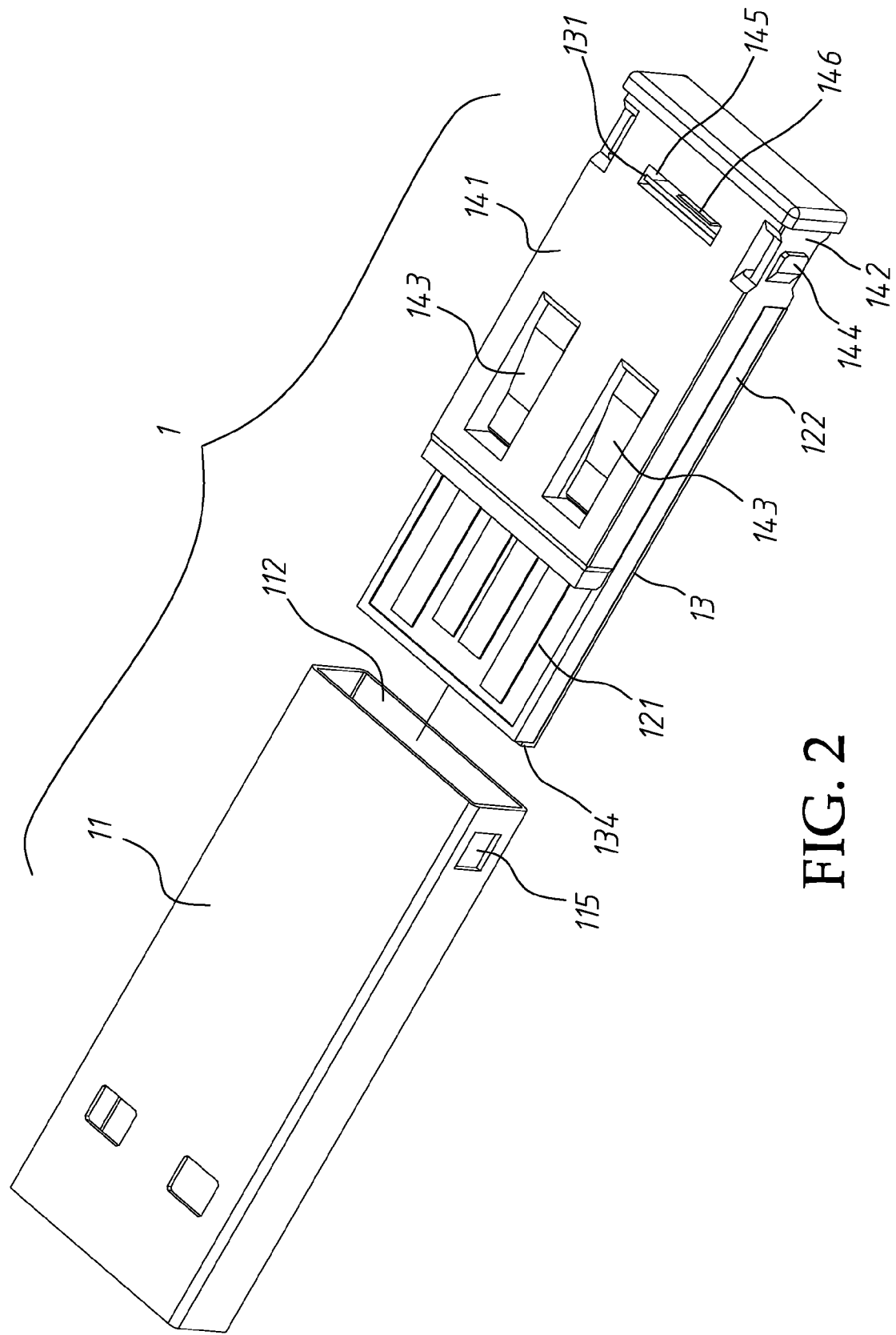
FIG. 2 is a perspective schematic view showing a partly assembled portion of the first embodiment of the present invention.
Figure 3:
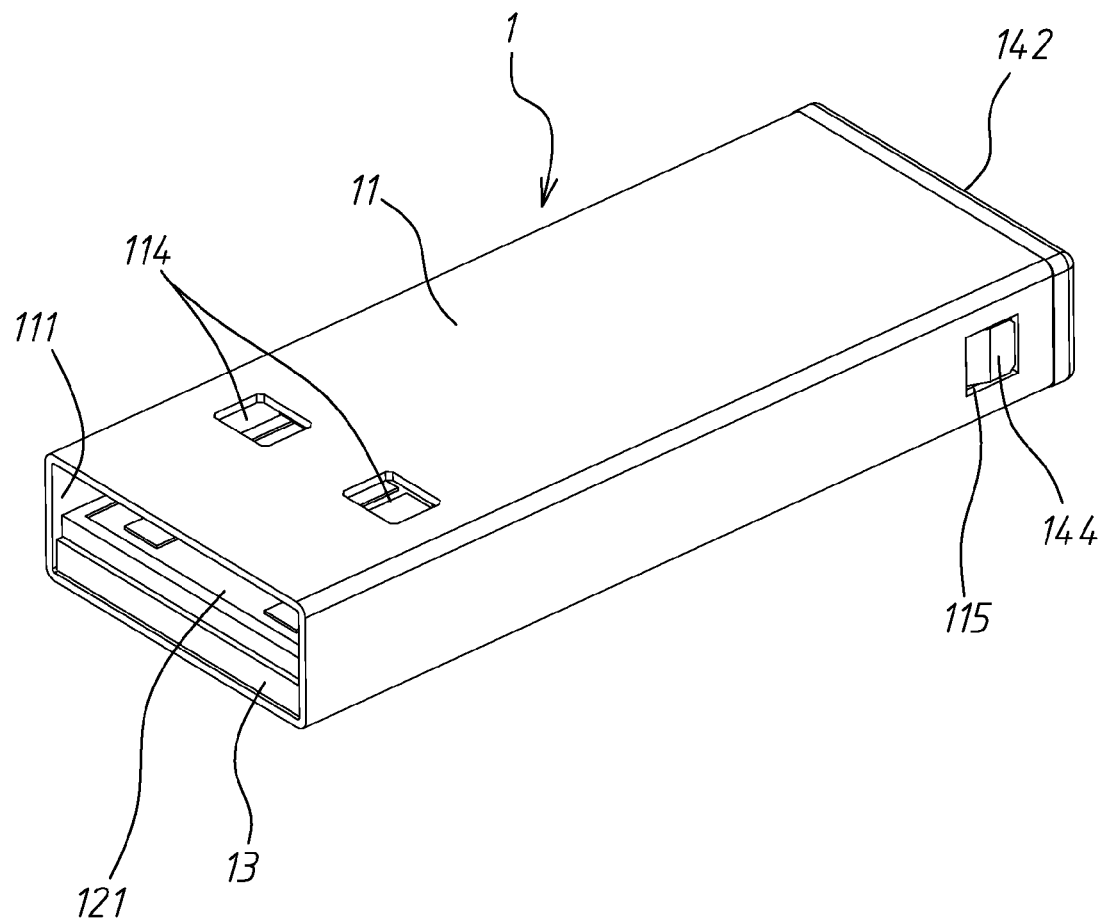
FIG. 3 is a perspective schematic view showing the first embodiment of the present invention is totally assembled.

Referring to FIGS. 1-3 showing a first embodiment of the present invention, wherein a USB flash disk 1 mainly is composed of a metallic housing 11, a printed circuit board 12, a metallic tray 13 and an insulation upper seat 14.

The metallic housing 11 is a none-joint rectangular pipe formed by drawing shaping, it has a front opening 111 and a rear opening 112, and has a pair of indentations 114 provided on its top surface 113 near the front opening 111. The metallic housing 11 is provided on its two lateral sides each with a through hole 115.

The printed circuit board 12 has a USB interface circuit 121 and an integrated packing circuit 122, the USB interface circuit 121 is provided in front of the integrated packing circuit 122. The printed circuit board 12 further has an indication light 123.

The metallic tray 13 is provided beneath the printed circuit board 12 to support the bottom of the latter. And the metallic tray 13 is provided at its rear edge with an upright engaging piece 131 having thereon an engaging hole 132. The metallic tray 13 is provided with two protruding ribs 133 to make higher of the printed circuit board 12, and is formed at its front edge an upright flange 134 for stopping a front end of the printed circuit board 12.

The insulation upper seat 14 is connected with the metallic tray 13, and is provided with a thinner front section 141 and a thicker rear section 142. The front section 141 envelops the outer surfaces of the integrated packing circuit 122 of the printed circuit board 12, while the rear section 142 extends over the rear edge of the printed circuit board 12 to cover the latter. The front section 141 of the insulation upper seat 14 is provided with an elastic unit 143 which includes a pair of elastic strips for pressing the printed circuit board 12 to make tight connection of the printed circuit board 12 with the metallic tray 13. The rear section 142 of the insulation upper seat 14 is provided on its two lateral sides each with a protrusion 144 to be engaged respectively in the through holes 115 on the two lateral sides of the metallic housing 11 such as shown in FIGS. 3 and 5. The rear section 142 of the insulation upper seat 14 is provided with a cut opening 145 at a position corresponding with that of the upright engaging piece 131, the cut opening 145 is formed therein a protruding engaging cube 146, the upright engaging piece 131 is extended into the cut opening 145, the engaging hole 132 is engaged with the protruding engaging cube 146 such as are shown in FIGS. 4 and 5.

In the present invention, the printed circuit board 12 is enveloped with the metallic tray 13 and the insulation upper seat 14, and is fixedly mounted in the metallic housing 11, the USB interface circuit 121 is allocated on a bottom surface in the front opening 111 and leaves a space S between it and a top surface 113 (please also refer to FIGS. 3 and 4), while the rear opening 112 is closed with the rear section 142 of the insulation upper seat 14.

In assembling the present invention, the printed circuit board 12 is placed in advance on the metallic tray 13, then the insulation upper seat 14 is taken to cover the printed circuit board 12, meantime the upright engaging piece 131 is extended into the cut opening 145, the engaging hole 132 of the upright engaging piece 131 is engaged with the protruding engaging cube 146 of the cut opening 145 such as is shown in FIG. 2. Then the printed circuit board 12, the metallic tray 13 and the insulation upper seat 14 being assembled together are inserted into the rear opening 112 of the metallic housing 11 to render the protrusions 144 on the two lateral sides of the insulation upper seat 14 to be engaged in the through holes 115 of the metallic housing 11 respectively, such as is shown in FIG. 3, to complete assembling of the whole USB.

The metallic housing 11 of the present invention is a none-joint rectangular pipe formed by drawing shaping, the surface of it is smooth without a seam, thereby the structure of the metallic housing 11 is stiffer than the conventional housing shaped by punch pressing and having a joint, the structure is not subjected to deformation. Particularly, this will render the metallic housing of the whole USB flash disk to be covered with no plastic sleeve for obscuring the joint, and thereby the cost of production of the present invention will be lowered a lot.

And more, by the fact that the metallic housing 11 is a none-joint rectangular pipe, it is formed by drawing shaping and then is cut to get a size desired, then the internal elements including the printed circuit board 12, the metallic tray 13 and the insulation upper seat 14 are inserted in a rear opening 112 of the metallic housing 11, such assembling is very fast and the size of the metallic housing 11 is very precise. And more, the surface of the metallic housing 11 can be treated with electro-plating, printing, laser carving or marked with a logo to get a beautiful appearance; the metallic housing 11 has much more variant features than conventional USB flash disks.

The insulation upper seat 114 in the present invention can be made of transparent material, in order that the light beams of the indication light on the printed circuit board 12 can be projected out of a rear end 142 of the insulation upper seat 14.

Figure 6:
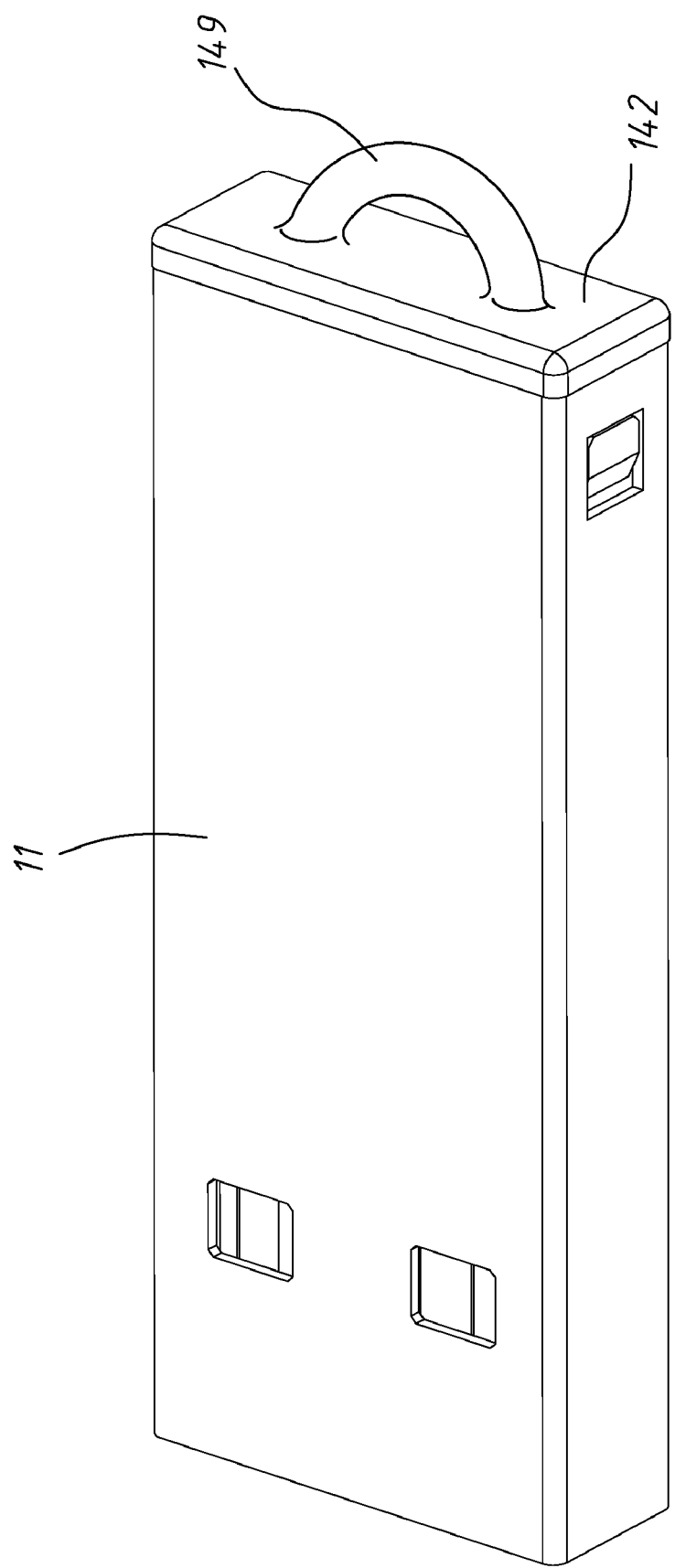
FIG. 6 is a perspective view showing the appearance of the first embodiment of the present invention which is formed thereon a loop.

As shown in FIG. 6, a loop 149 is formed on an end face of the rear section 142 of the insulation upper seat 14 and extends out of the metallic housing 11.

Figure 7:
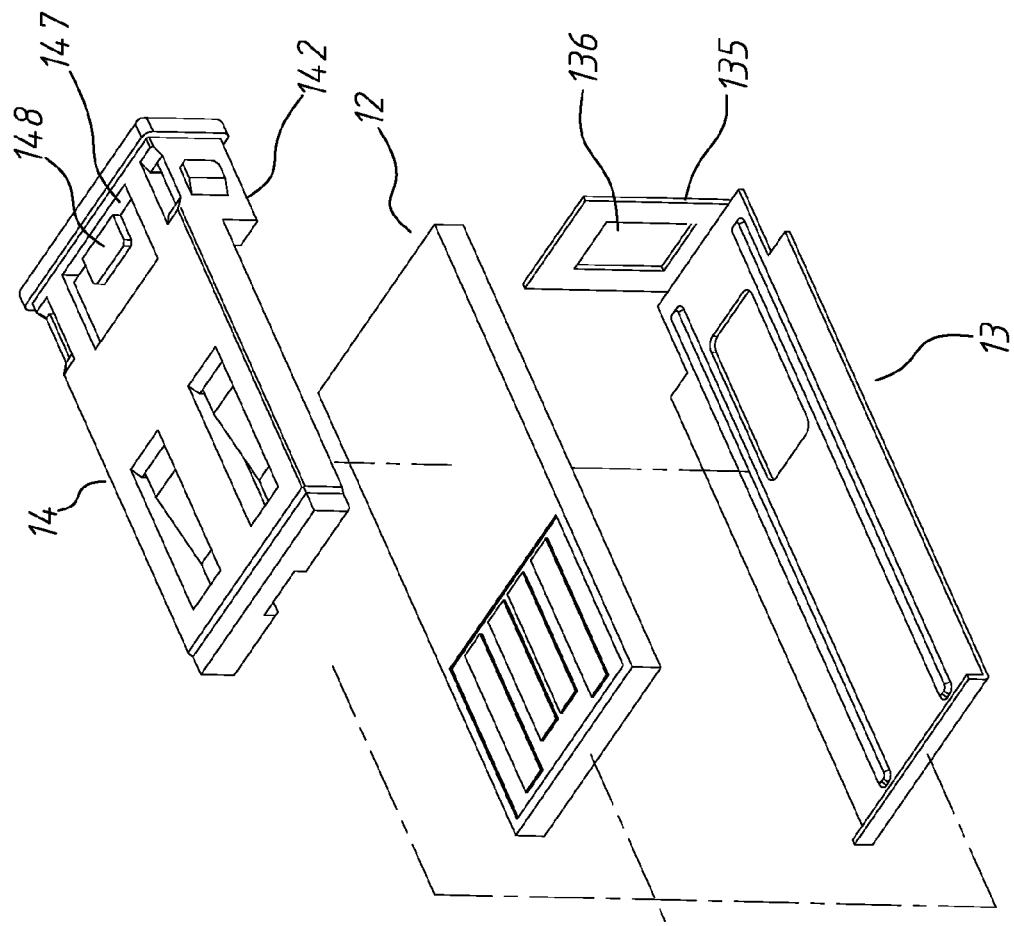
FIG. 7 is an anatomic perspective view of a second embodiment of the present invention.
Figure 8:
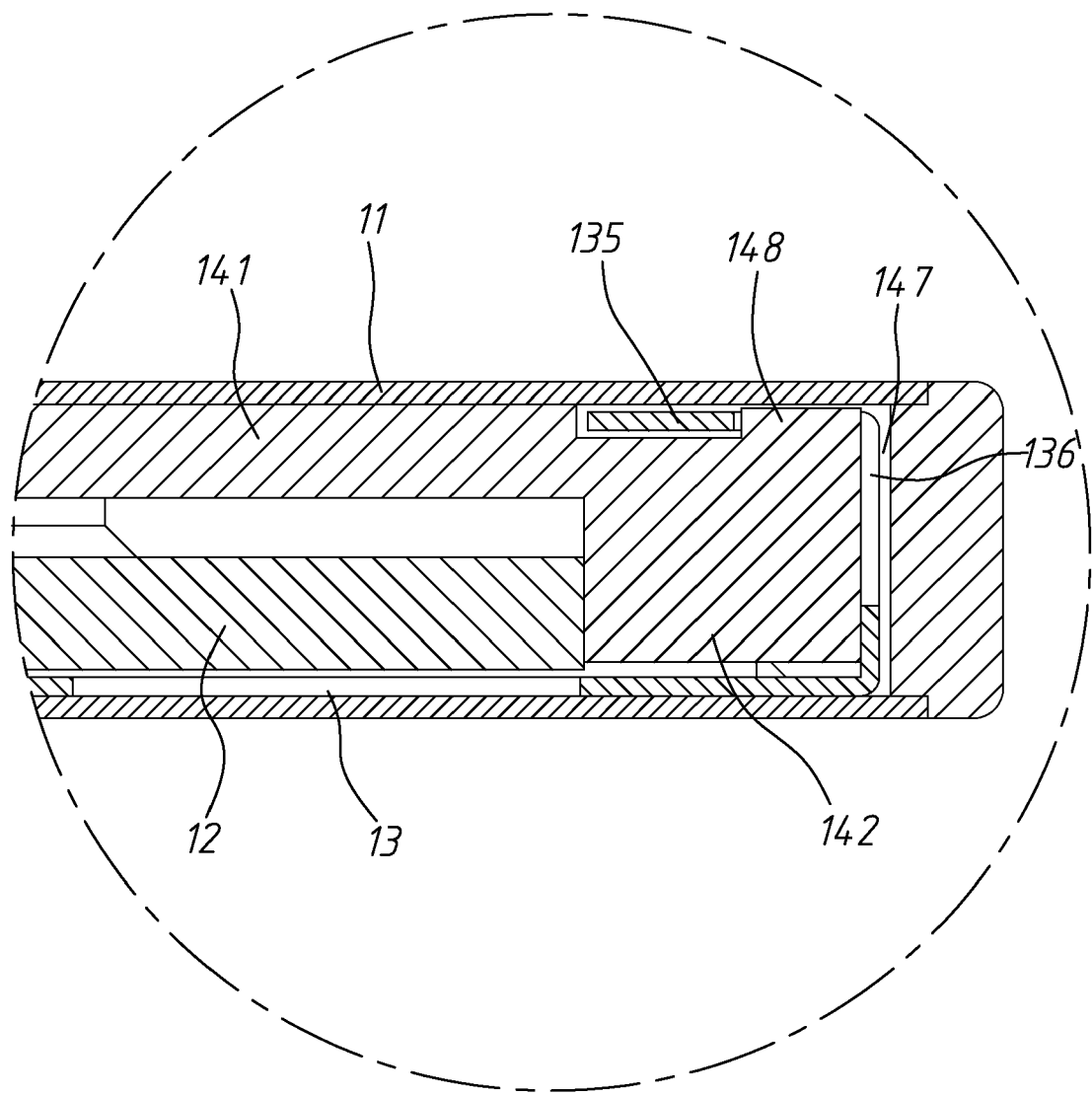
FIG. 8 is a sectional view of the second embodiment of the present invention.
Figure 9:
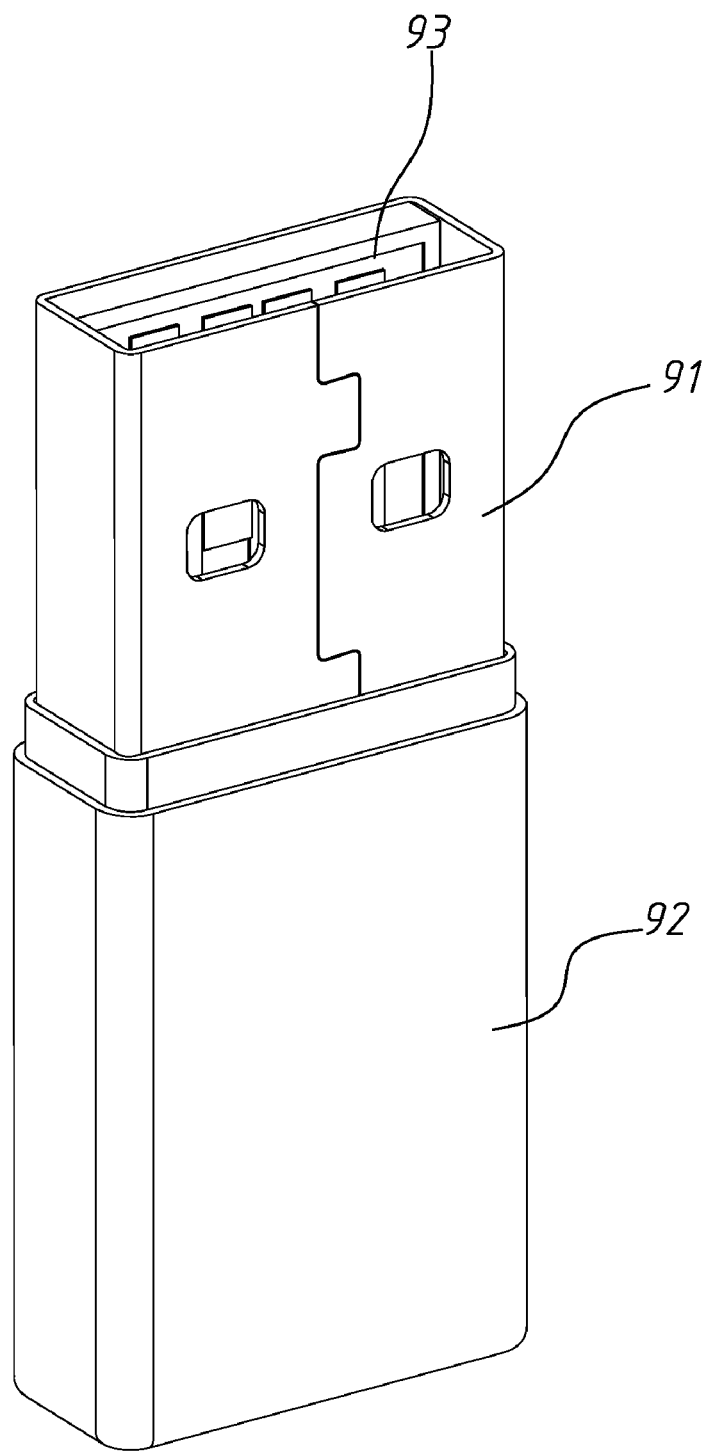
FIG. 9 is a perspective view showing the appearance of a conventional USB flash disk.
Figure 10:
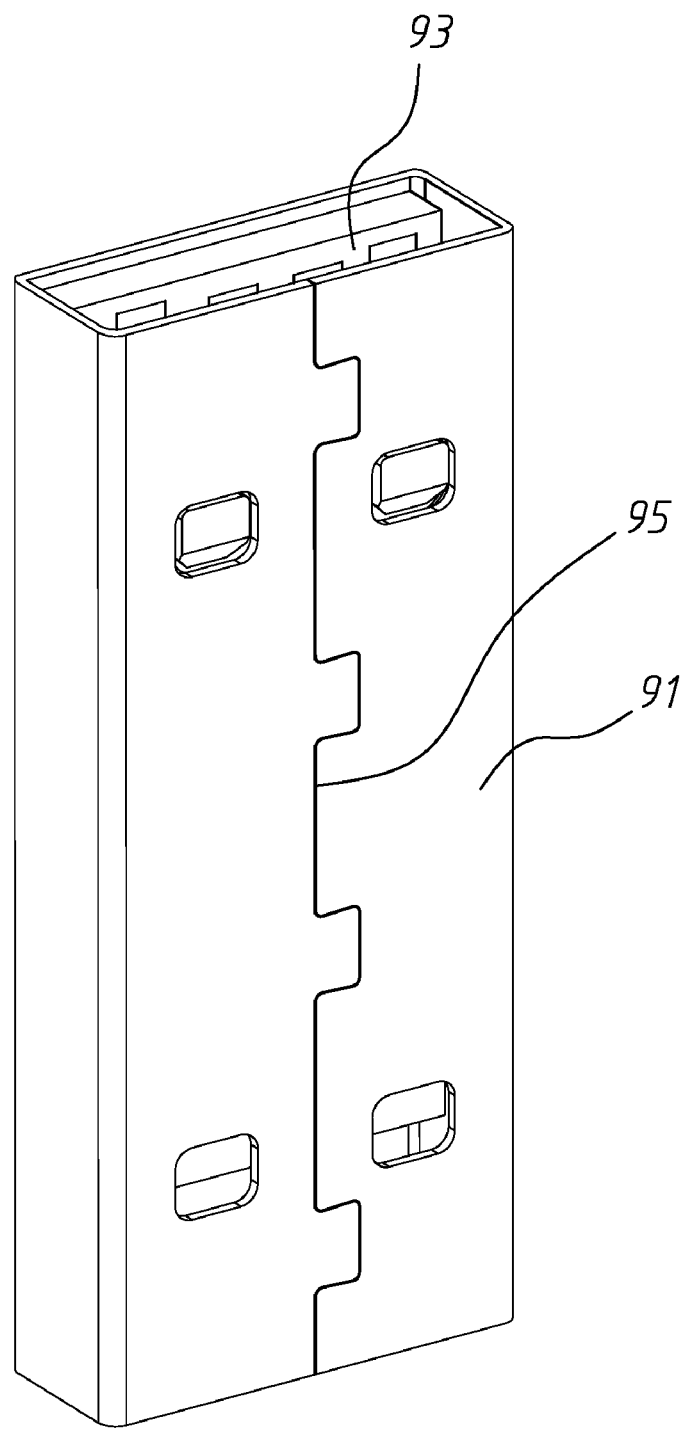
FIG. 10 is a perspective view showing the conventional USB flash disk of FIG. 9, but having its plastic sleeve removed.
Figure 11:
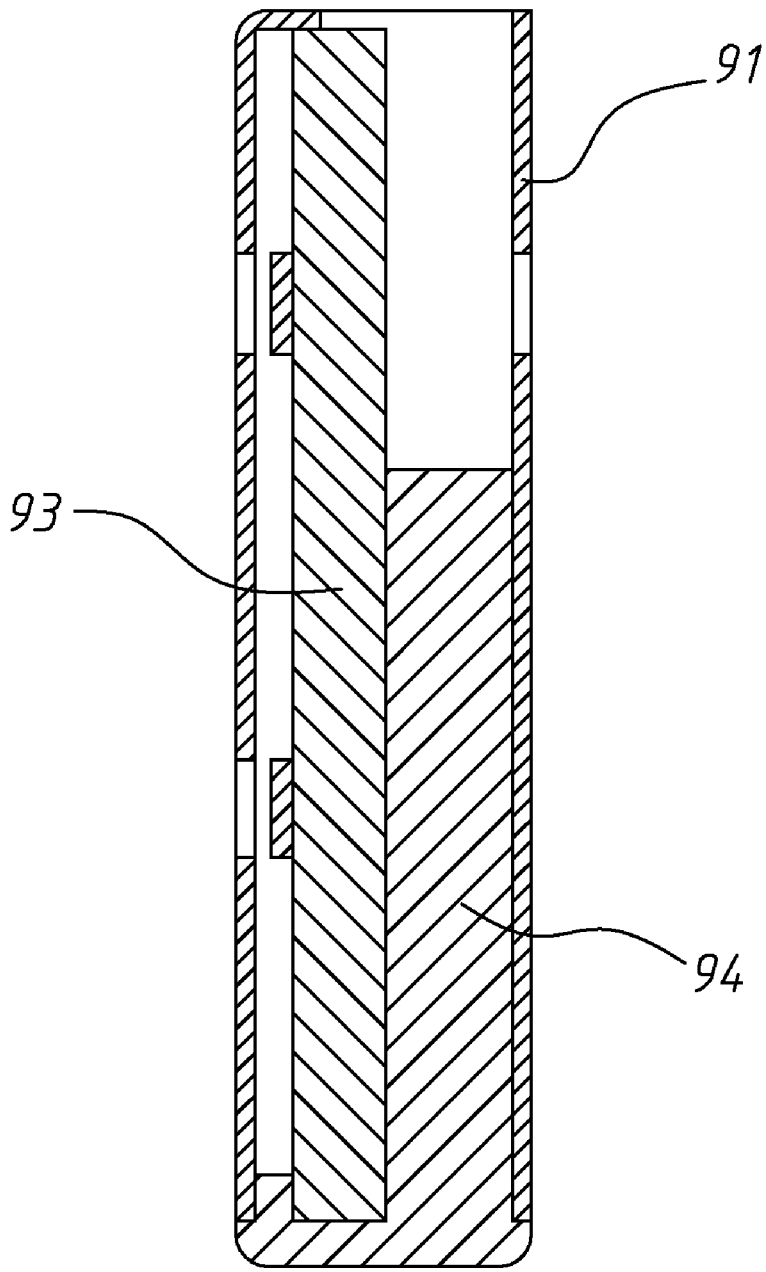
FIG. 11 is a sectional view taken from FIG. 10.

Further as shown in FIGS. 7 and 8 which show a second embodiment of the present invention, like the way of the first embodiment, a metallic tray 13 of the second embodiment is provided at its rear edge with a foldable upright engaging piece 135 having thereon an engaging hole 136. And the rear section 142 of the insulation upper seat 14 is provided with a cut opening 147 at a position corresponding with that of the foldable upright engaging piece 135 for extending of the foldable upright engaging piece 135 in the cut opening 147, an engaging cube 148 is formed on the upper surface of the rear section 142. After the foldable upright engaging piece 135 extends into the cut opening 147, the foldable upright engaging piece 135 is folded down over the engaging cube 148 of the rear section 142, thereby the engaging hole 136 is engaged with the engaging cube 148 such as are shown in FIG. 8.

In conclusion, the brand new structure of USB flash disk of the present invention truly meets the elements of having the nature of novelty and improvement of a patent; and having thus described the present invention which meets the conditions of patentability,

What I claim as new and desire to be secured by Letters Patent of the United States are:

1. A USB flash disk with a none-joint metallic housing comprising:
    a metallic housing which is a none-joint rectangular pipe formed by drawing shaping, and has a front opening and a rear opening, further has a pair of indentations provided on a top surface thereof near said front opening;
    a printed circuit board having at least a USB interface circuit and an integrated packing circuit, said USB interface circuit is provided in front of said integrated packing circuit;
    a metallic tray provided beneath said printed circuit board to support a bottom of said printed circuit board;
    an insulation upper seat connected with said metallic tray, and provided with a thinner front section and a thicker rear section, said front section envelops an outer surfaces of said integrated packing circuit of said printed circuit board, while said rear section extends over a rear edge of said printed circuit board;
    said printed circuit board is enveloped with said metallic tray and said insulation upper seat, and is fixedly mounted in said metallic housing, said USB interface circuit is allocated on a bottom surface in said front opening and leaves a space between it and a top surface, while said rear opening is closed with said rear section of said insulation upper seat;
    wherein said metallic tray is provided at a rear edge thereof with a foldable upright engaging piece having thereon an engaging hole; and a rear section of said insulation upper seat is provided with a cut opening at a position corresponding with that of said foldable upright engaging piece for extending of said foldable upright engaging piece in said cut opening, an engaging cube is formed on an upper surface of said rear section; after said foldable upright engaging piece extends into said cut opening, said foldable upright engaging piece is folded down over said engaging cube of said rear section, thereby said engaging hole is engaged with said engaging cube.

2. The USB flash disk with a none-joint metallic housing as claimed in claim 1, wherein said front section of the insulation upper seat is provided with an elastic unit which presses said printed circuit board to make tight connection of said printed circuit board with said metallic tray.

3. The USB flash disk with a none-joint metallic housing as claimed in claim 1, wherein a rear section of said insulation upper seat is provided on two lateral sides thereof each with a protrusion to be engaged respectively in two through holes on two lateral sides of said metallic housing.

4. The USB flash disk with a none-joint metallic housing as claimed in claim 1, wherein said printed circuit board further has an indication light, said insulation upper seat is made of transparent material, in order that light beams of said indication light are projected out of a rear end of said insulation upper seat.

5. The USB flash disk with a none-joint metallic housing as claimed in claim 1, wherein said metallic tray is provided with two protruding ribs to make higher of said printed circuit board.

6. The USB flash disk with a none-joint metallic housing as claimed in claim 1, wherein said metallic tray is formed at a front edge thereof an upright flange for stopping a front end of said printed circuit board.

7. The USB flash disk with a none-joint metallic housing as claimed in claim 1, wherein a loop is formed on an end face of a rear section of said insulation upper seat and extends out of said metallic housing.

\* \* \* \* \*